(12) United States Patent
Kato et al.

(10) Patent No.: US 11,532,660 B2
(45) Date of Patent: Dec. 20, 2022

(54) PHOTOELECTRIC CONVERSION DEVICE

(71) Applicant: CANON KABUSHIKI KAISHA, Tokyo (JP)

(72) Inventors: Tatsunori Kato, Kawasaki (JP); Akira Oseto, Kawasaki (JP); Ryunosuke Ishii, Tokyo (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 474 days.

(21) Appl. No.: 16/687,860

(22) Filed: Nov. 19, 2019

(65) Prior Publication Data

US 2020/0168652 A1 May 28, 2020

(30) Foreign Application Priority Data

Nov. 22, 2018 (JP) .............................. JP2018-219443

(51) Int. Cl.
*H01L 27/146* (2006.01)
*H01L 27/11* (2006.01)
*H01L 23/528* (2006.01)
*G11C 11/418* (2006.01)
*H01L 23/00* (2006.01)
(Continued)

(52) U.S. Cl.
CPC ...... *H01L 27/14634* (2013.01); *G11C 11/418* (2013.01); *G11C 11/419* (2013.01); *H01L 23/528* (2013.01); *H01L 24/05* (2013.01); *H01L 24/08* (2013.01); *H01L 27/1104* (2013.01); *H01L 27/1116* (2013.01); *H04N 5/376* (2013.01); *H04N 5/378* (2013.01); *H04N 5/379* (2018.08); *H01L 2224/05647* (2013.01); *H01L 2224/08147* (2013.01); *H01L 2924/1437* (2013.01)

(58) Field of Classification Search
CPC ......... H01L 27/14636; H01L 27/14634; H01L 2924/1434; G11C 11/419
See application file for complete search history.

(56) References Cited

U.S. PATENT DOCUMENTS 3,779,544 A 12/1973 Wasielewski et al.
7,911,521 B2 3/2011 Kuroda et al.
(Continued)

FOREIGN PATENT DOCUMENTS

JP 2015-126043 A 7/2015

OTHER PUBLICATIONS

U.S. Appl. No. 16/703,144, filed Dec. 4, 2019 (First Named Inventor: Ryunosuke Ishii).

*Primary Examiner* — David A Zarneke
(74) *Attorney, Agent, or Firm* — Venable LLP

(57) ABSTRACT

A photoelectric conversion device including a plurality of substrates in a stacked state, the plurality of substrates including a first substrate and a second substrate electrically connected to each other, the photoelectric conversion device comprising: a memory cell unit including row-selection lines that are to be driven upon selection of a row of a memory cell array and column-selection lines that are to be driven upon selection of a column of the memory cell array; and a memory peripheral circuit unit that includes row-selection line connection portions and column-selection line connection portions so as to drive the row-selection lines and to drive the column-selection lines, wherein a first portion that is at least a part of the memory peripheral circuit unit is formed on the first substrate and the memory cell unit is formed on the second substrate.

16 Claims, 15 Drawing Sheets

(51) Int. Cl.
  *G11C 11/419* (2006.01)
  *H04N 5/378* (2011.01)
  *H04N 5/376* (2011.01)
  *H04N 5/369* (2011.01)

(56) References Cited

U.S. PATENT DOCUMENTS

| | | |
|---|---|---|
| 7,920,192 B2 | 4/2011 | Watanabe et al. |
| 7,982,789 B2 | 7/2011 | Watanabe et al. |
| 3,134,190 A1 | 3/2012 | Okita et al. |
| 3,466,532 A1 | 6/2013 | Watanabe |
| 8,570,418 B2 | 10/2013 | Watanabe |
| 9,123,621 B2 | 9/2015 | Watanabe |
| 9,762,836 B2 | 9/2017 | Kurose |
| 2011/0003426 A1 | 1/2011 | Watanabe et al. |

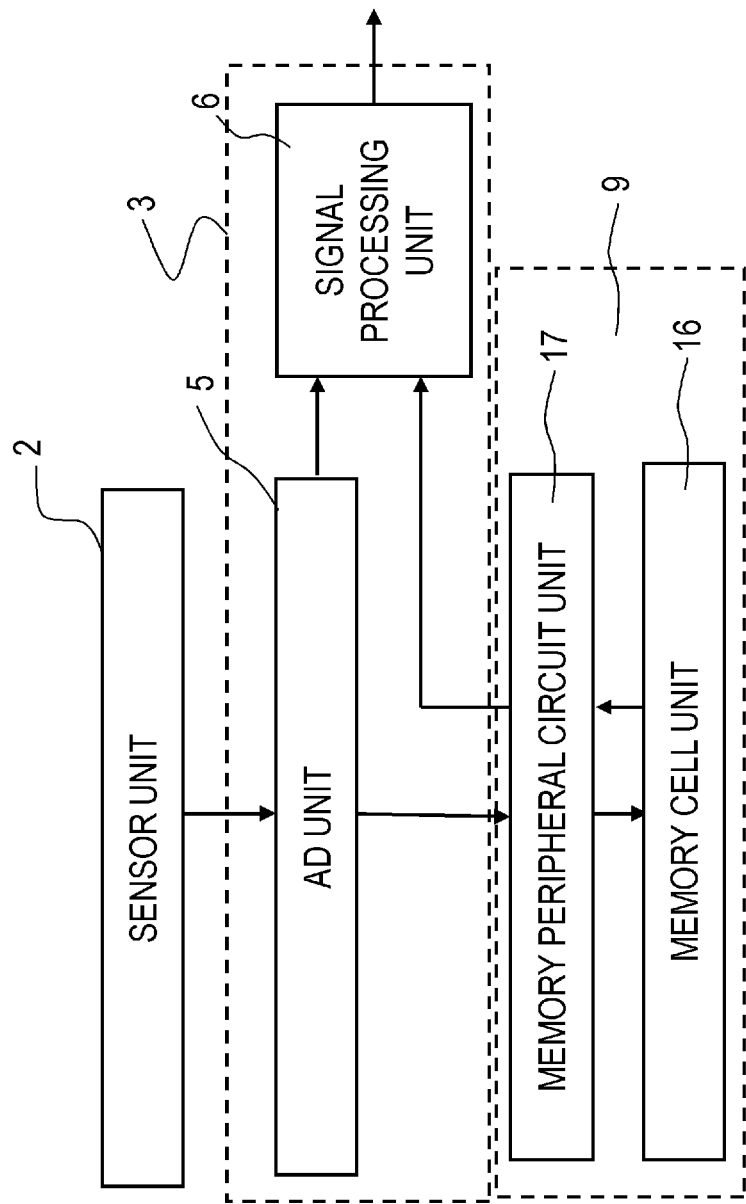

PHOTOELECTRIC CONVERSION DEVICE

BACKGROUND OF THE INVENTION

Field of the Invention

The present invention relates to a photoelectric conversion device.

Description of the Related Art

In recent years, in photoelectric conversion devices such as image sensors, demands for size reduction, high integration, and enhancement of read speed of pixel signals are growing. Accordingly, signal amounts processed in a photoelectric conversion device increases and the signal processing method becomes complicated. To achieve such a photoelectric conversion device, Japanese Patent Application Publication No. 2015-126043 proposes a technique for using installed memory for various types of signal processing while achieving size reduction and high integration by stacking a plurality of semiconductor substrates.

The solid-state imaging device disclosed in Japanese Patent Application Publication No. 2015-126043 has a structure in which a semiconductor substrate having a sensor unit and another semiconductor substrate having a control circuit for the sensor unit, a logic circuit for signal processing (referred to below as a sensor peripheral circuit unit) and the like are stacked. A plurality of pixels (sensors) for generating optical signals are formed in a two-dimensional array in the sensor unit. In addition, a memory installed together with the sensor peripheral circuit unit includes a memory cell unit in which memory bit cells for storing signals are formed in a two-dimensional array and a memory peripheral circuit unit that controls read or write operations or the like by accessing a memory cell unit having an arbitrary address.

SUMMARY OF THE INVENTION

To achieve the improvement of the performance of a photoelectric conversion device, such as higher definition, higher frame rates, and higher functions, the memory installed in the photoelectric conversion device needs to have improved performance. Specifically, for example, the amount of installed memory needs to be increased and the write and read speed of the memory needs to be increased. The inventors of the present application have found that the process for forming the memory bit cells of the memory cell unit needs to be selected in terms of fineness and the process for forming peripheral circuits needs to be selected in terms of high processing speed.

However, in the solid-state imaging device disclosed in Japanese Patent Application Publication No. 2015-126043, when the semiconductor substrate having a memory is generated, the memory cell unit and the memory peripheral circuit unit of the memory need to be formed using the same process generation. Accordingly, the process conditions dedicated to the performance of the memory cell unit and the performance of the memory peripheral circuit cannot be selected separately, and the memory performance thus cannot be improved sufficiently.

Accordingly, an object of this technique is to improve the memory performances in various photoelectric conversion devices such as solid-state imaging devices.

A first aspect of the technology of the present disclosure is:
a photoelectric conversion device comprising:
a plurality of substrates which are stacked, the plurality of substrates including a first substrate and a second substrate electrically connected to each other;
a memory cell unit including
(1) a memory cell array in which a plurality of memory cells are disposed in a two-dimensional array, each of the memory cells being configured to store a one-bit signal,
(2) row-selection lines each of which is to be driven upon selection of a corresponding row of the memory cell array, and
(3) column-selection lines each of which is to be driven upon selection of a corresponding column of the memory cell array; and
a memory peripheral circuit unit including (1) row-selection line connection portions for connecting to the row-selection lines of the memory cell unit and (2) column-selection line connection portions for connecting to the column-selection lines of the memory cell unit, the memory peripheral circuit unit being configured to drive the row-selection lines of the memory cell unit through the row-selection line connection portions and to drive the column-selection lines of the memory cell unit through the column-selection line connection portions, wherein
a first portion that is at least a part of the memory peripheral circuit unit is formed on the first substrate and the memory cell unit is formed on the second substrate.

According to this technique, the memory performance of the photoelectric conversion device can be improved.

Further features of the present invention will become apparent from the following description of exemplary embodiments with reference to the attached drawings.

BRIEF DESCRIPTION OF THE DRAWINGS

FIG. 2 illustrates a processing flow of an imaging signal according to the first embodiment;

DESCRIPTION OF THE EMBODIMENTS

First Embodiment

An image sensor (CMOS image sensor) will be described as a photoelectric conversion device according to a first embodiment. It should be noted here that the structure of the image sensor in this embodiment is only an example and the present invention is not limited to the embodiment.

In this embodiment, by forming a memory cell unit and a memory peripheral circuit unit on different substrates in the image sensor in which a plurality of semiconductor substrates are stacked, the process condition specific to the performance of each of these units can be selected. This configuration can improve the memory performance of the image sensor (photoelectric conversion device).

Logical Structure of Image Sensor

Figure 1A:
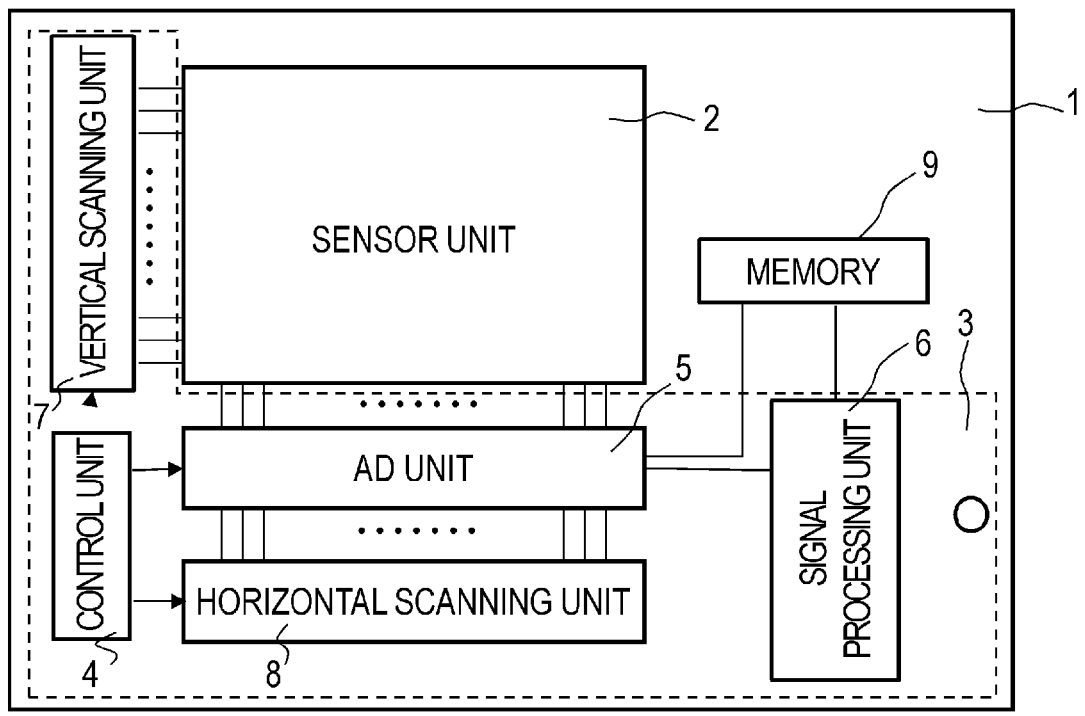
FIGS. 1A and 1B are logical structure diagrams illustrating an image sensor according to a first embodiment.

First, the logical structure of an image sensor 1 according to the first embodiment will be described with reference to FIG. 1A. The image sensor 1 includes a sensor unit 2, a sensor peripheral circuit unit 3, and a memory 9. The sensor unit 2 has a plurality of pixels (sensors) that output analog electric signals. The plurality of pixels (sensors) are disposed in a two-dimensional array. Each of the pixels includes a photoelectric conversion element for converting incident light to (analog signals) electric charges. The sensor peripheral circuit unit 3 includes at least one of a circuit that drives the sensor unit 2 and a circuit that processes a signal output from the sensor unit 2. The sensor peripheral circuit unit 3 includes a control unit 4, an AD unit 5, a signal processing unit 6, a vertical scanning unit 7, and a horizontal scanning unit 8. The control unit 4 totally controls the sensors. The vertical scanning unit 7 selects a sensor line by which an analog electric signal is obtained from the sensor unit 2. The AD unit 5 performs analog-digital conversion (AD conversion) of an analog electric signal obtained from the sensor unit 2. The horizontal scanning unit 8 selects a digital signal to be output to the signal processing unit 6 or the memory 9 from the digital signals subjected to AD conversion. The signal processing unit 6 performs signal processing on the digital signals subjected to AD conversion. The memory 9 is used to read and write the output digital signal as needed.

Logical Structure of Memory

Figure 1B:
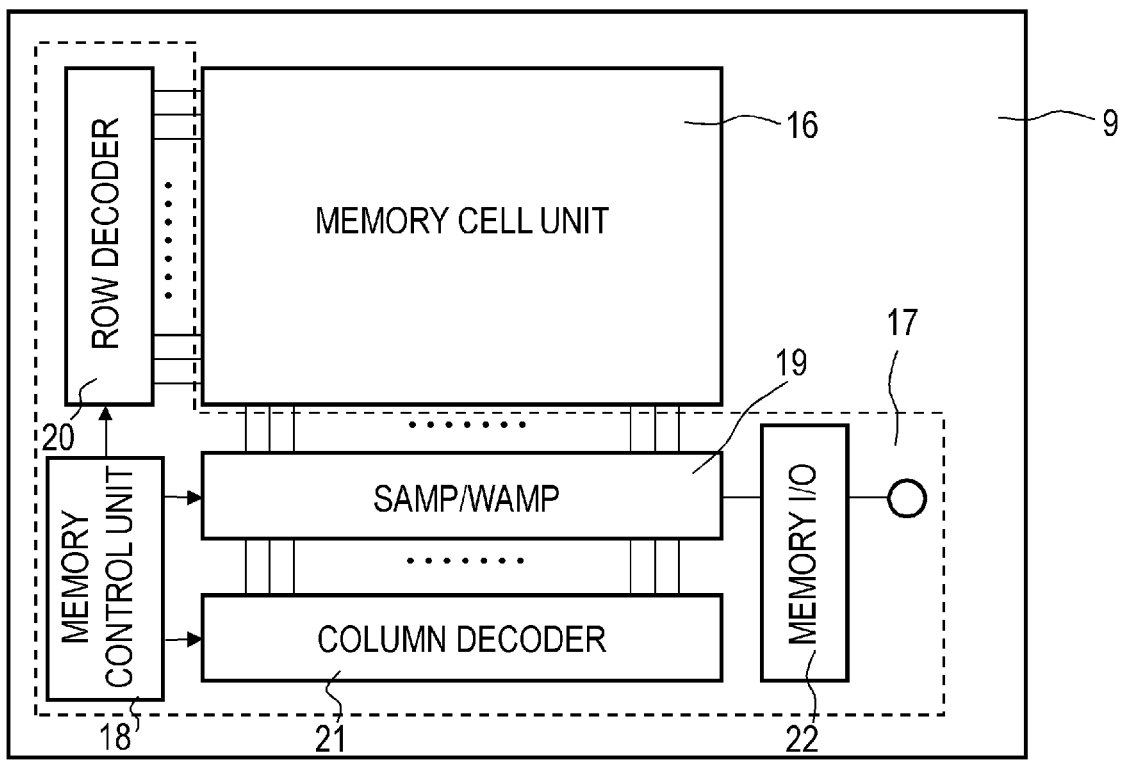

Next, the logical structure of the memory 9 will be described with reference to FIG. 1B. The memory 9 includes a memory cell unit 16 and a memory peripheral circuit unit 17. The memory cell unit 16 includes memory bit cells (memory cells), each of the cells being configured to store a one-bit signal, are disposed in a two-dimensional array. The memory peripheral circuit unit 17 includes a memory control unit 18, a sense amplifier/write amplifier unit (SAMP/WAMP unit, amplification unit) 19, a row decoder 20, a column decoder 21, and a memory I/O 22. The memory control unit 18 controls an overall memory system. The row decoder 20 selects the memory bit cell (row of the memory bit cell) corresponding to any row address among the memory bit cells in the memory cell unit 16 and the column decoder 21 selects the memory bit cell (column of the memory bit cell) corresponding to any column address. The sense amplifier/write amplifier unit 19 amplifies the signal to be read from or written to the memory bit cell selected by the row decoder 20 and the column decoder 21, and the memory I/O 22 is an input-output port through which a signal is read and written.

Although the structure of a static random-access memory (SRAM), which is an example of the memory 9, is described, an SRAM is only an example and the invention is not limited to the example. The memory 9 may include a volatile memory such as a dynamic random-access memory (DRAM) or may include a non-volatile memory.

Processing Flow of Imaging Signal

Next, a processing flow of an imaging signal imaged by the sensor unit 2 will be described with reference to FIG. 2.

The sensor unit 2 outputs the obtained (imaged) imaging signal to the AD unit 5.

The AD unit 5 converts an imaging signal, which is an analog signal, into a digital signal and temporarily stores the digital signal in a column memory inside the AD unit 5. In addition, the AD unit 5 performs parallel-serial conversion on the digital signal stored in the column memory for each column. The digital signal subjected to parallel-serial conversion by the AD unit 5 is output to the memory peripheral circuit unit 17 when written to the memory 9 and is output to the signal processing unit 6 when not written to the memory 9.

In the memory 9, the memory peripheral circuit unit 17 amplifies the signal subjected to parallel-serial conversion. Then, the memory peripheral circuit unit 17 performs address specification, which is an operation for determining the memory bit cell of the memory cell unit 16 to which the signal is written, and writes (stores) the digital signal to the memory bit cell. That is, the memory peripheral circuit unit 17 stores the signal output from the sensor unit 2 in the memory cell unit 16. The operation of directly storing the signal from the sensor unit 2 in the memory cell unit 16 and the operation of storing the signal obtained by performing signal processing on the signal output from the sensor unit 2 in the memory cell unit 16 are both operations of storing the signal output from the sensor unit 2 in the memory cell unit 16. It should be noted here that, when reading a digital signal from the memory 9, the memory peripheral circuit unit 17 similarly performs address specification and reads and amplifies the digital signal stored in the memory cell unit 16. The read and amplified signal is output to the signal processing unit 6.

The signal processing unit 6 sequentially performs signal processing on the received signal. Specifically, the signal processing executed by the signal processing unit 6 is correlated double sampling processing (CDS processing), signal correction processing, or the like. The signal processing unit 6 outputs the signal subjected to signal processing to another component in the image sensor 1 or to the outside of the image sensor 1.

External Appearance Structure of Image Sensor

Figure 3A:
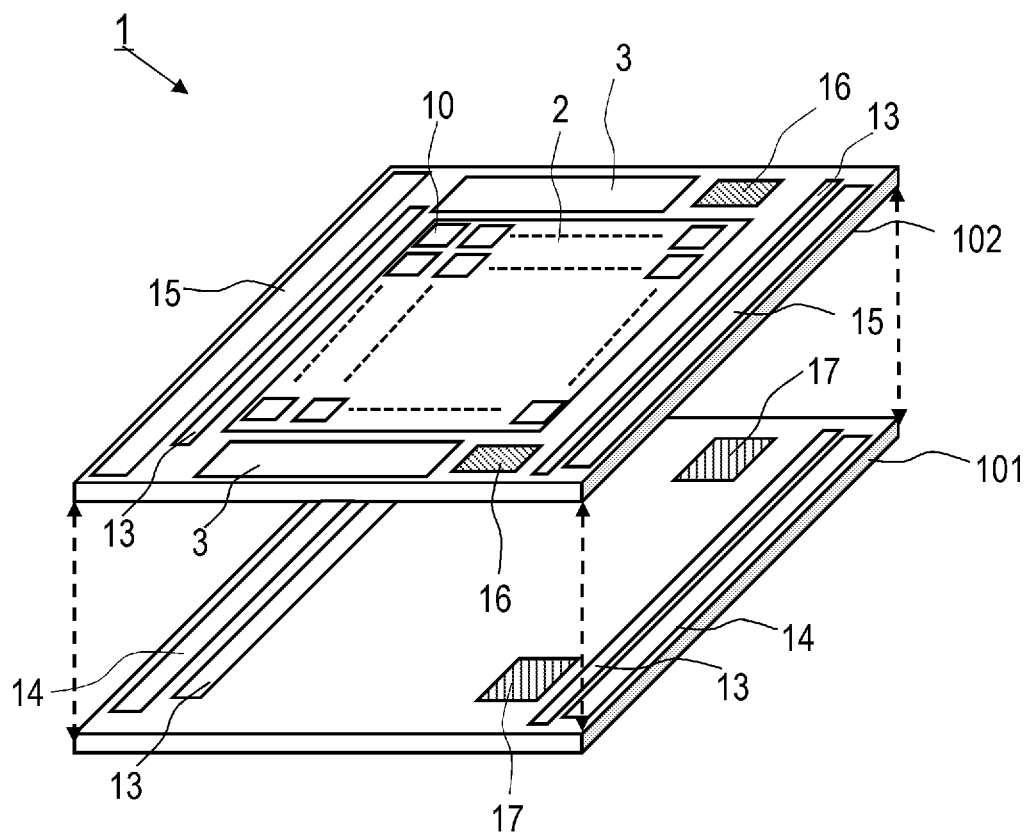
FIGS. 3A and 3B illustrate the external appearance of the image sensor according to the first embodiment.

The external appearance structure of the image sensor 1 will be described below with reference to an external appearance view in FIG. 3A. The image sensor 1 has a structure (stacked structure) in which a semiconductor substrate 101 and a semiconductor substrate 102 are stacked. It should be noted here that the semiconductor substrate 101 is electrically connected to the semiconductor substrate 102. When the substrate having the memory cell unit 16 is assumed to be a second substrate, the semiconductor substrate 101 is a first substrate and the semiconductor substrate 102 is the second substrate in the embodiment.

The semiconductor substrate 102 includes the sensor unit 2, the sensor peripheral circuit unit 3, and the memory cell unit 16 that sores digital signals. In the sensor unit 2, a plurality of sensors 10 are disposed in a two-dimensional array. In addition, the semiconductor substrate 102 has the PAD opening 15, which is a space through which the image sensor 1 is electrically connected to the outside of the sensor.

The semiconductor substrate 101 includes a memory peripheral circuit unit 17 that controls a reading operation, a writing operation, and the like with respect to the memory cell unit 16. In addition, the semiconductor substrate 101 has a PAD unit 14 that is an external connection electrode for electrically connecting the image sensor 1 to the outside of the sensor. The PAD unit 14 can be electrically connected to the outside of the image sensor 1 through the PAD opening 15. It should be noted here that the PAD opening 15 does not need to be formed in the semiconductor substrate 102 and the PAD unit 14 does not need to be formed on the semiconductor substrate 101. That is, the PAD unit 14 may be formed on the semiconductor substrate 102 and the PAD opening 15 may be formed in the semiconductor substrate 101.

It should be noted here that the semiconductor substrate 101 and the semiconductor substrate 102 can be laminated (or connected, or joined) to each other by the well-known method disclosed in Japanese Patent Application Publication No. 2015-126043. In addition, an electrical connection (stacked connection) between the sensor peripheral circuit unit 3 on the semiconductor substrate 102 and the memory peripheral circuit unit 17 on the semiconductor substrate 101 can be made through via 13 (via plug (VIA)), which is a conductor made of copper or the like. The stacked connection through the via 13 may be, for example, a so-called through silicon via (TSV) method or a Cu—Cu bonding (CCB) method. The Cu—Cu bonding (CCB) method is a connection method that brings a plurality of copper electrodes (conductors) into contact. In addition, the via 13 may be formed according to the purpose such as control signal use, power supply use, or sensor signal use in the stacked connection. The vias 13 do not need to be formed on the right and left sides of the semiconductor substrate as illustrated in FIG. 3A.

In the control unit 4, the AD unit 5, the signal processing unit 6, the vertical scanning unit 7, and the horizontal scanning unit 8 included in the sensor peripheral circuit unit 3, all or some of the configurations (elements) may be formed on the semiconductor substrate 101.

As described above, in the memory 9 installed in the image sensor 1, the memory cell unit 16 is formed on the semiconductor substrate 102 and the memory peripheral circuit unit 17 is formed on the semiconductor substrate 101. Accordingly, in the structure in which the memory cell unit 16 and the memory peripheral circuit unit 17 are formed on different substrates, the memory cell unit 16 and the memory peripheral circuit unit 17 can be manufactured by different processes. That is, since the memory peripheral circuit unit 17 mainly includes logic circuits, it is possible to adopt a process capable of manufacturing a fine, low-voltage, high-speed transistors. For the memory cell unit 16, a process for forming fine memory bit cells can be adopted. Accordingly, the memory performance of the image sensor 1 can be improved.

A part of the sensor peripheral circuit unit 3 that can be manufactured by the process of forming the memory peripheral circuit unit 17 may be formed in a space that can be obtained by reducing the area of the memory peripheral circuit unit 17. As a result, the area efficiency of the entire chip can be improved. In addition, by making the circuit threshold of the transistors included in the memory peripheral circuit unit 17 relatively lower than in the transistors included in the memory cell unit 16, memory characteristics such as the read and write speed can be improved. The circuit threshold indicates, for example, the border of electric voltage level for detecting ON and OFF of a digital circuit. That is, the transistors included in the memory cell unit 16 have a higher circuit threshold than the transistors included in the memory peripheral circuit unit 17.

Via

Figure 3B:
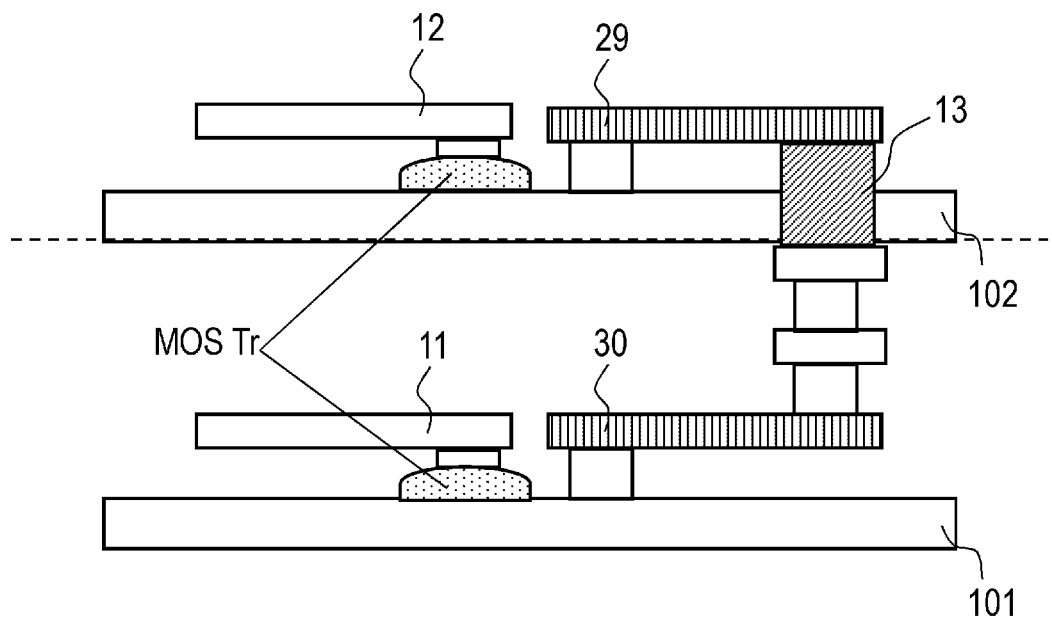

The via 13, which is the stacked connection portion, will be described below with reference to a conceptual view illustrated in FIG. 3B. An example of electrically connecting a MOS transistor (MOS Tr) formed on the semiconductor substrate 102 and a circuit 12 connected to the MOS transistor to a MOS transistor formed on the semiconductor substrate 101 and a circuit 11 connected to the MOS transistor will be described.

The MOS transistor and the circuit 12 formed on the semiconductor substrate 102 are electrically connected to the via 13 through an inter-substrate connection unit 29 (wiring layer) formed on the semiconductor substrate 102. In addition, the MOS transistor and the circuit 12 formed on the semiconductor substrate 102 is electrically connected to the MOS transistor and the circuit 11 formed on the semiconductor substrate 101 through an inter-substrate connection unit 30 (wiring layer) formed on the semiconductor substrate 101. Although a method of inter-substrate connection for the structure in which two semiconductor substrates are stacked, a similar inter-substrate connection method is also applicable to a structure in which three or more semiconductor substrates are stacked. That is, even in a structure in which three or more semiconductor substrates are stacked, adjacent substrates only need to be electrically connected to each other through the inter-substrate connection unit.

About Sensor Unit

Figure 4:
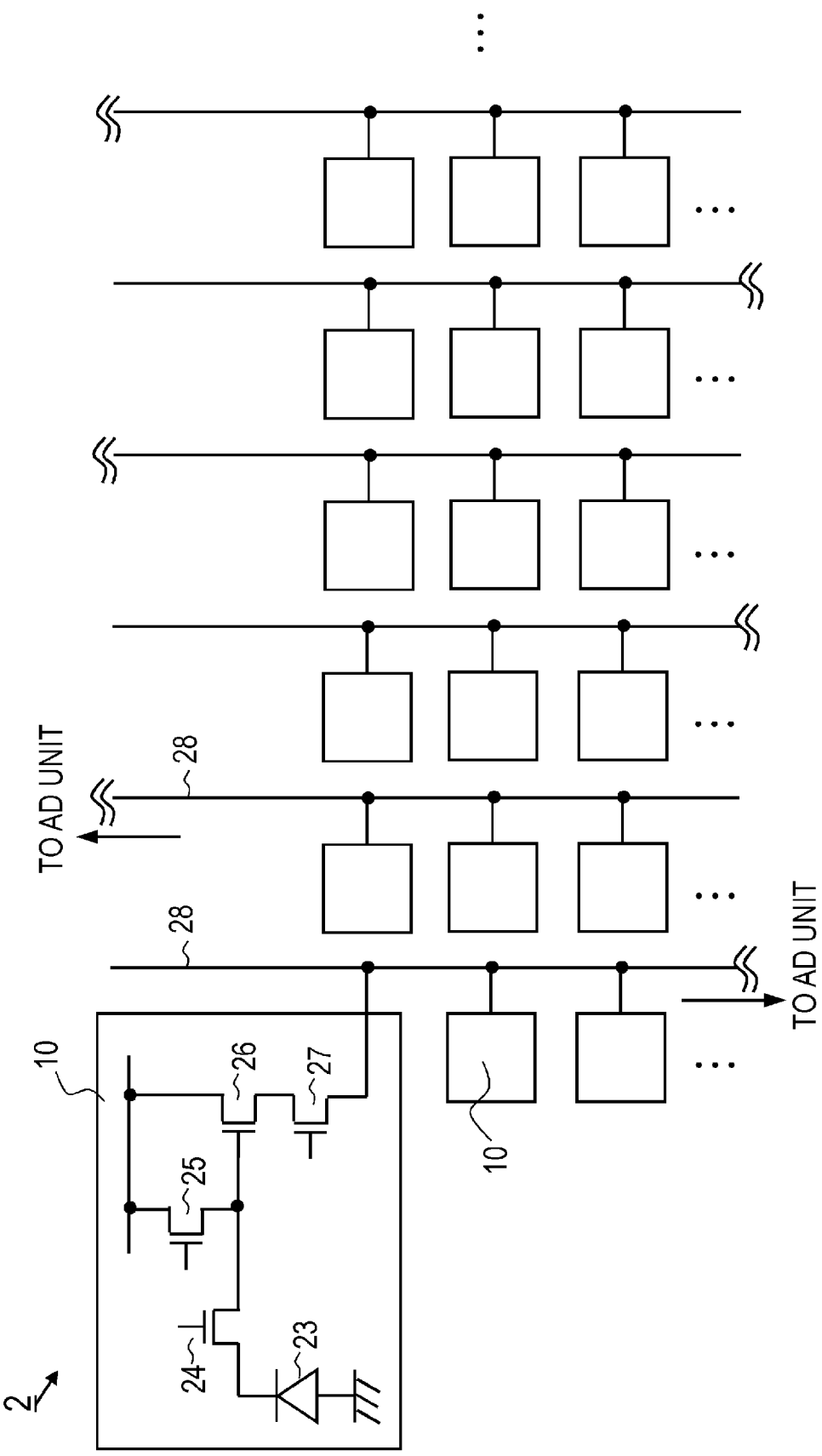
FIG. 4 is a circuit diagram of a sensor unit according to the first embodiment.

The structure of the circuit of the sensor unit 2 including the plurality of sensors 10 will be described with reference to the circuit diagram illustrated in FIG. 4. Each of the sensors 10 converts incident light into an electric charge and outputs a signal (analog signal or digital signal) that is based on the converted electric charge. Accordingly, each of the sensors 10 includes a photodiode 23, a transfer transistor (TX Tr) 24, a reset transistor (RST Tr) 25, an amplifier transistor 26, and a row-selection transistor (SEL Tr) 27. The signal output from the sensor 10 passes through a vertical output line 28 and is transmitted to the AD unit 5, which is a part of the sensor peripheral circuit unit 3. It should be noted here that the vertical output line 28 and the AD unit 5 do not need to be formed for each column of the sensors 10 as illustrated in FIG. 4 and may be formed for each of blocks each including the plurality of sensors 10 or for each of the sensors 10. When the sensor 10 includes an AD conversion circuit, the sensor 10 outputs a digital signal.

AD Unit

Figure 5:
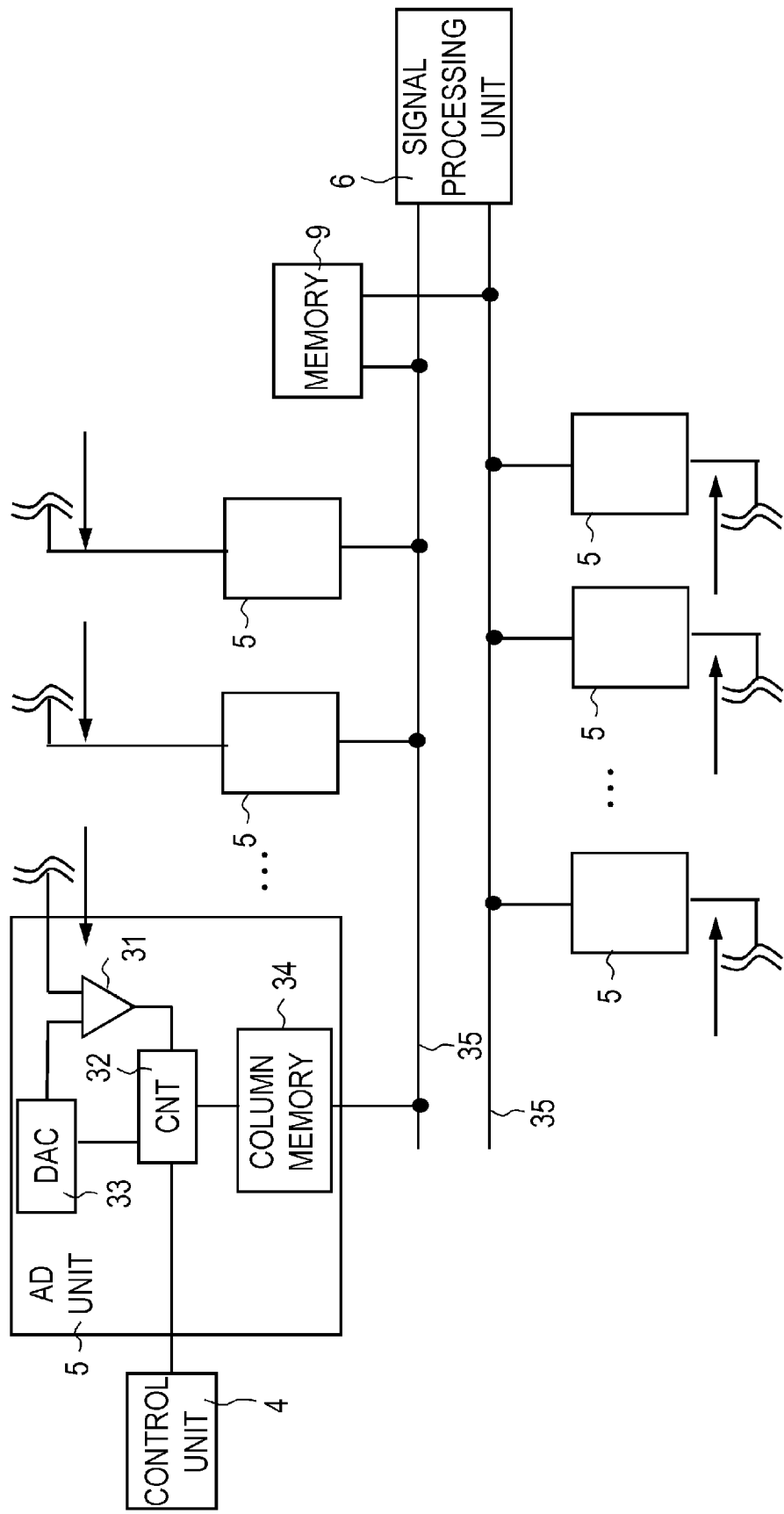
FIG. 5 is a circuit diagram of an AD unit according to the first embodiment.

The structure of the AD unit 5 will be described with reference to the circuit diagram illustrated in FIG. 5. The AD unit 5 includes a comparator 31, a counter (CNT) 32, a digital-to-analog converter (DAC) 33, and a column memory 34. The counter 32 outputs a predetermined digital signal and the digital-to-analog converter 33 converts the digital signal to an analog signal. The analog signal output by the sensor unit 2 is input to the comparator 31, compared with the analog signal output by the digital-to-analog converter 33, and converted to a digital signal. The digital signal subjected to AD conversion is transmitted to horizontal output lines 35, and subjected to signal processing by the signal processing unit 6 while being read from or written to the memory 9 as necessary.

Flow of Signal in Memory

Figure 6:
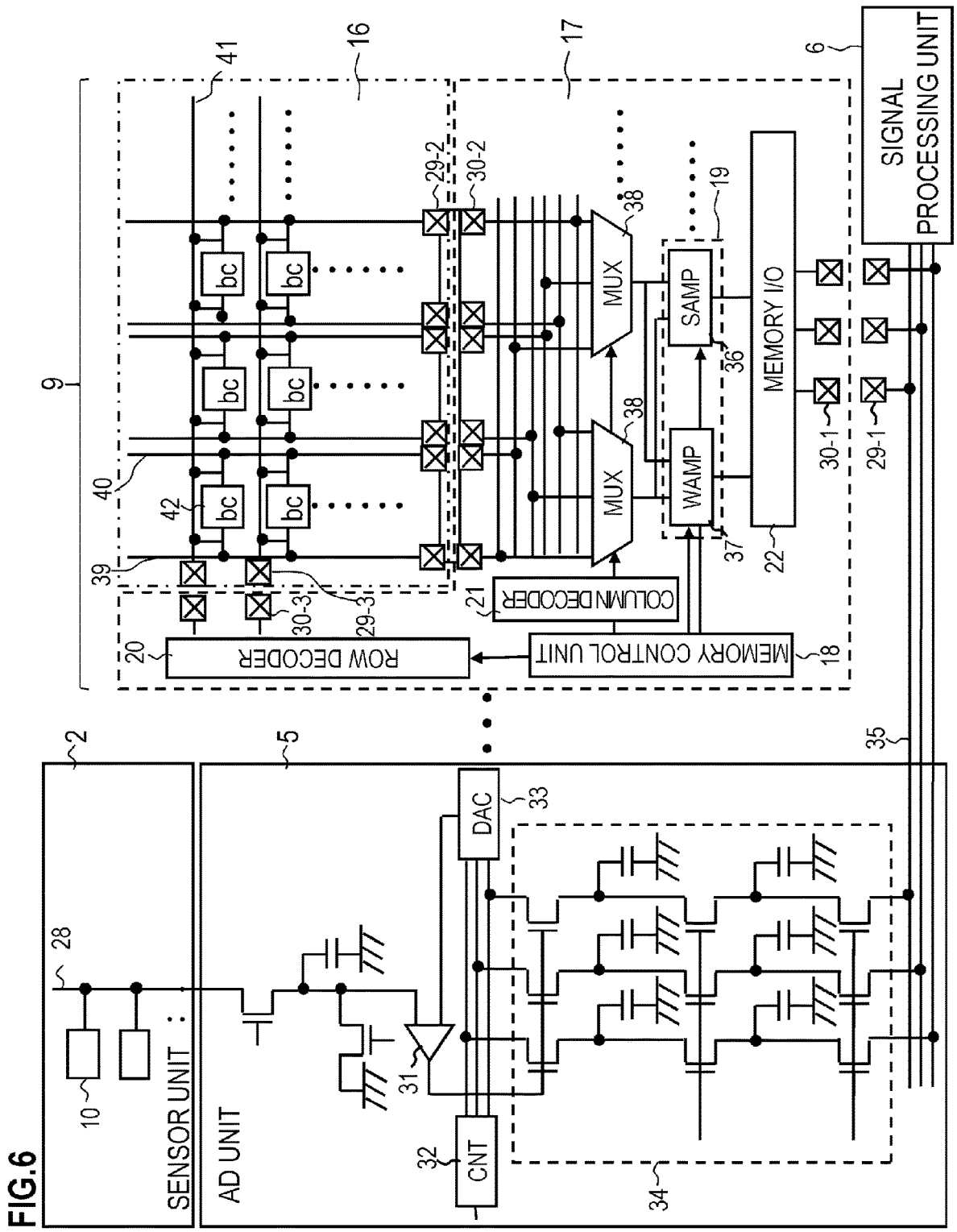
FIG. 6 is a circuit diagram for describing a memory according to the first embodiment.

A specific flow of signals in the memory 9 will be described with reference to the circuit diagram illustrated in FIG. 6. It should be noted here that the via 13 is omitted in FIG. 6. First, an operation for writing a digital signal subjected to AD conversion to the memory 9 will be described.

(1) The digital signal and control signal output from the AD unit 5 are transmitted from the inter-substrate connection unit 29-1 to the via 13 and then to the inter-substrate connection unit 30-1 formed on the semiconductor substrate 101.

(2) The signals are transmitted to the inter-substrate connection unit 30-2 (column-selection line connection portion) and the inter-substrate connection unit 30-3 (row-selection line connection portion) through the memory I/O 22, the SAMP/WAMP unit 19, a MUX 38, and the like. The inter-substrate connection unit 30-2 for connecting to the column-selection lines and the inter-substrate connection unit 30-3 for connecting to the row-selection lines of the memory cell unit 16 are included in the memory peripheral circuit unit 17.

(3) The signals are transmitted to the inter-substrate connection units 29-2 and 29-3 formed on the semiconductor substrate 102 through the via 13 and the digital signal is written to the memory cell unit 16. At this time, under control of the memory control unit 18, the row decoder 20 selects (drives) a word line 41 (row-selection line) and the column decoder 21 selects (drives) a bit line pair (Bit line 39 (column-selection line)/Bit Bar line 40) in the memory cell unit 16. This causes the memory control unit 18 to select a memory bit cell (bc) 42 to which the digital signal is written. Thus, the memory peripheral circuit unit 17 drives the bit line pair through the inter-substrate connection unit 30-2 and the word line 41 through the inter-substrate connection unit 30-3. Then, a WAMP 37 amplifies the signal received by the memory I/O 22 and writes the amplified signal to the selected memory bit cell 42. It should be noted here that a SAMP 36 and the WAMP 37 are parts of the configurations included in the SAMP/WAMP unit 19.

As described above, in this embodiment, the signal output from the sensor unit 2 is transmitted between substrates a plurality of times after the signal is output from the sensor unit 2 and until the signal is stored in the memory bit cell 42 of the memory cell unit 16.

It should be noted here that the number of Bits (the number of input-output Bits) in input and output between the memory I/O 22 and the horizontal output lines 35 can be reduced by connecting the multiplexer (MUX) 38, which receives a plurality of inputs and outputs one signal, to a Bit line pair. However, a connection to the MUX 38 is not always necessary. The number of input and output Bits can also be reduced similarly by disposing and connecting the MUX 38 between the memory I/O 22 and the SAMP/WAMP unit 19.

Next, reading the signal having been written to the memory 9 will be described briefly.

(1) Under control of the memory control unit 18, the row decoder 20 selects the word line 41 and the column decoder 21 selects a Bit line pair so as to select the memory bit cell 42 to be read.

(2) Since the electric potential of the Bit line pair changes according to the digital signal stored in the selected memory bit cell 42, the SAMP 36 amplifies the digital signal and reads the amplified digital signal.

(3) The read digital signal is transmitted to the signal processing unit 6 through the memory I/O 22, the inter-substrate connection units 30-1 and 29-1, and the like as in a writing operation.

Memory Bit Cell

Figure 7:
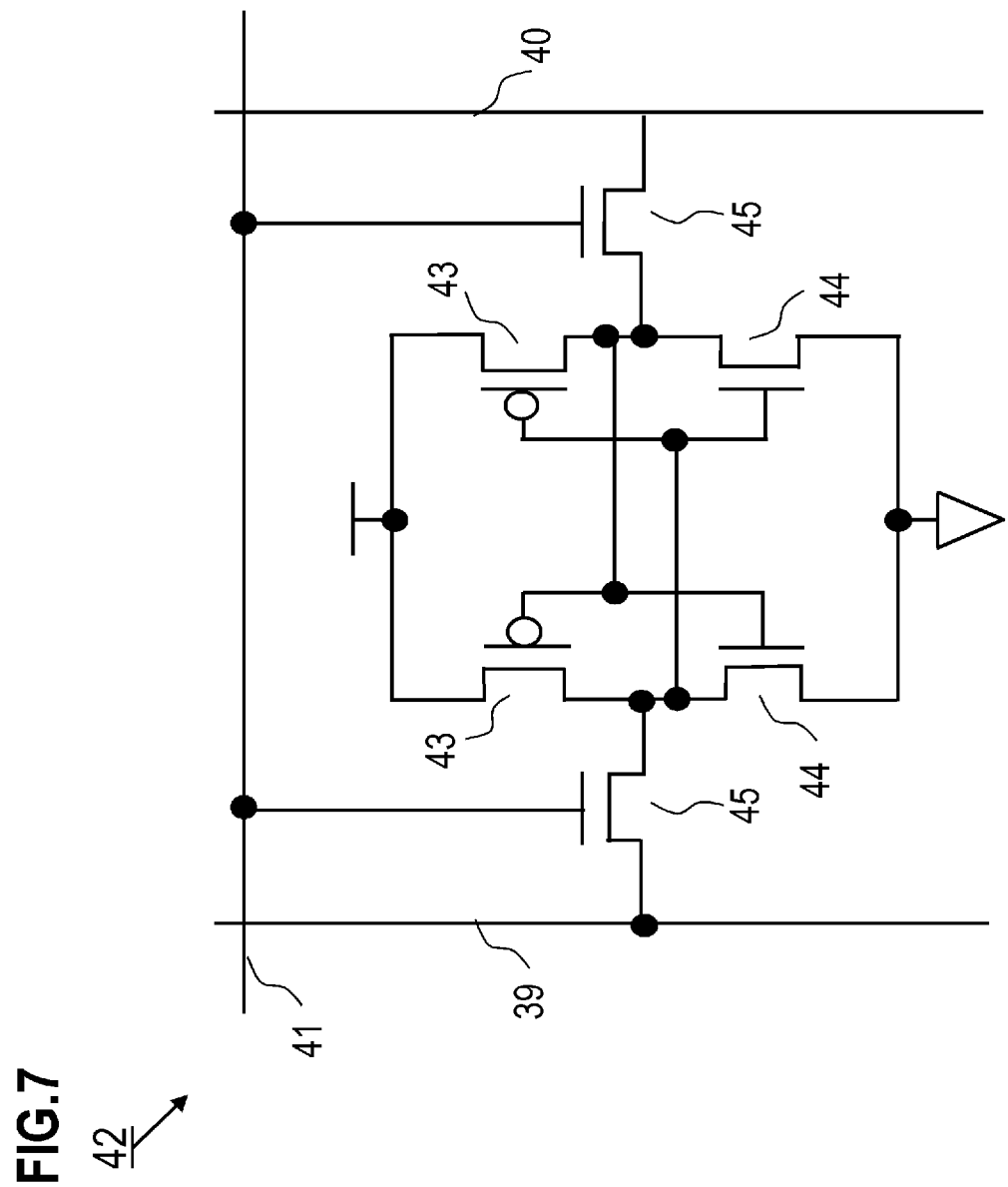
FIG. 7 is a circuit diagram of a memory bit cell according to the first embodiment.

The structure of the circuit of the memory bit cell 42 will be described with reference to the circuit diagram illustrated in FIG. 7. The memory bit cell 42 includes six transistors: two load transistors (load Tr) 43, two driver transistors (driver Tr) 44, and two transfer transistors (transfer Tr) 45. A digital signal can be stored by an inverter pair including the load transistor 43 and the driver transistor 44. In the case of writing, by driving the transfer transistor 45, the state of the Bit line pair can be written to the memory bit cell 42 as a digital signal. In contrast, in the case of reading, by driving the transfer transistor 45, the state of the memory bit cell 42 can be read to the Bit line pair as a digital signal.

Effects

In the embodiment, by mounting the memory cell unit and the memory peripheral circuit unit on different semiconductor substrates in the image sensor having a structure in which a plurality of semiconductor substrates are stacked, the memory cell unit and the memory peripheral circuit unit can be manufactured by different processes. That is, by adopting different design rules for the memory cell unit and the memory peripheral circuit unit, transistors for high speed processing can be formed in the memory peripheral circuit unit and the area of the memory bit cells can be reduced in the memory cell unit. As a result, the memory amount can be increased. In addition, the read speed and the write speed of the memory peripheral circuit can be improved. Furthermore, since the fine lithography generation and the number of wiring layers can be selected separately between the process for constructing the memory cell unit and the process for constructing the memory peripheral circuit, the cost concerning a process and the const concerning the manufacturing of a photo mask can be suppressed. Accordingly, a high-definition and high-frame-rate image sensor can be provided at low cost.

First Modification

Figure 8A:
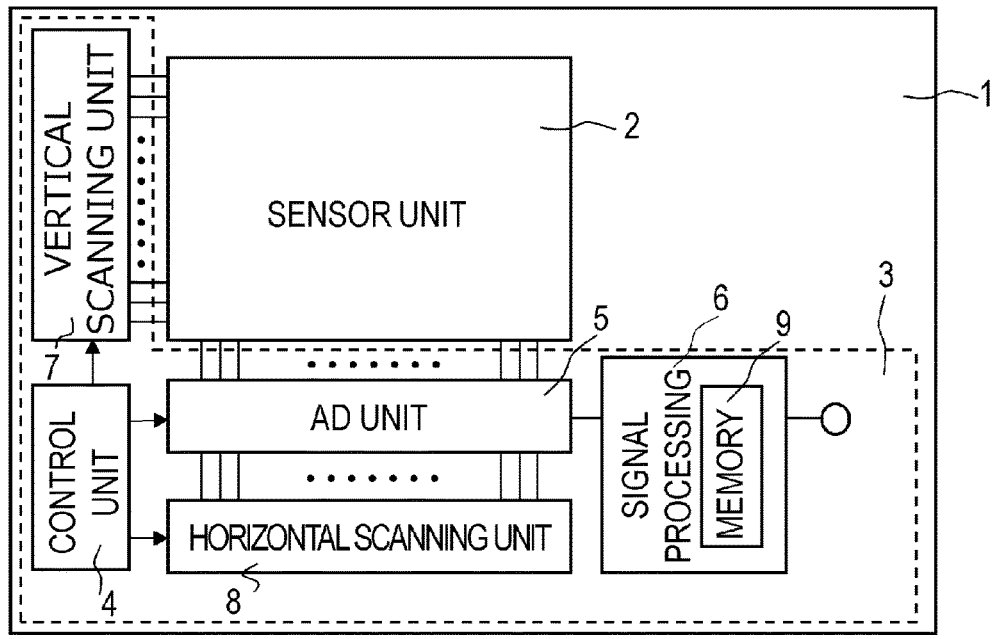
FIGS. 8A and 8B are figures for describing an image sensor according to a first modification.

It should be noted here that the structure of the image sensor 1 is not limited to the structure in the first embodiment and may be the structure as illustrated in FIG. 8A that is a modification of the first embodiment. That is, the image sensor 1 may have a structure in which the memory 9 is included as a part of the signal processing unit 6.

Figure 8B:
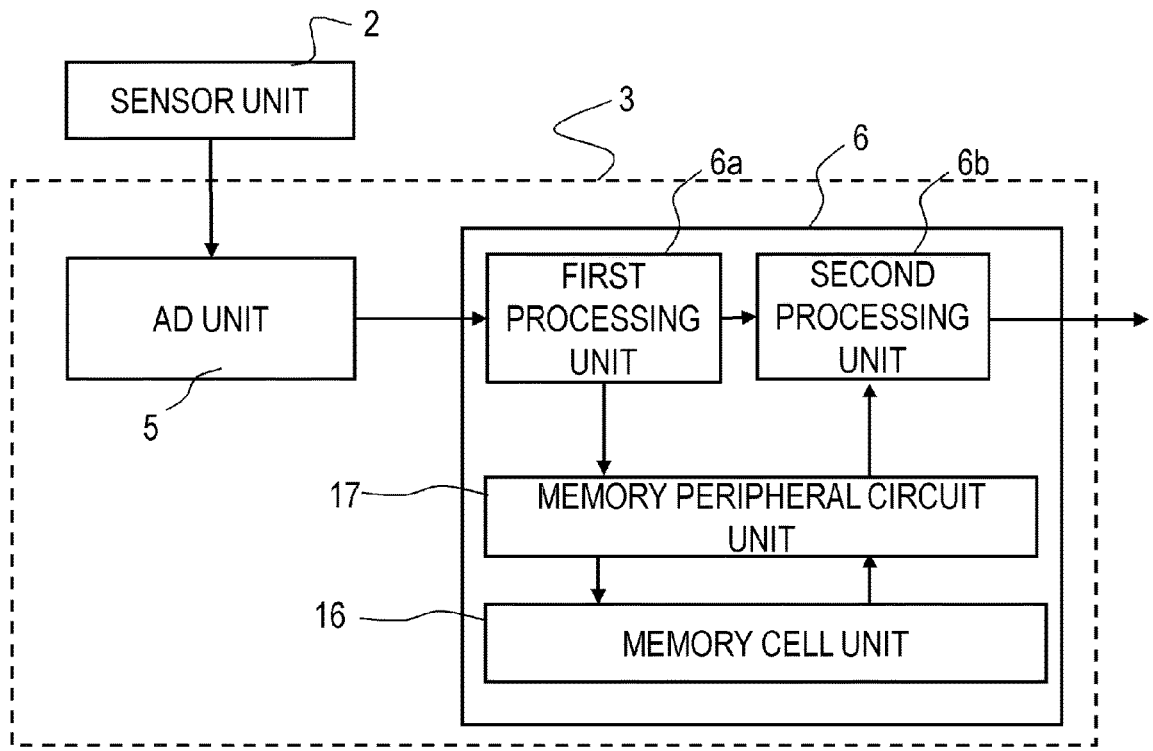

FIG. 8B illustrates a flow of an imaging signal output by the sensor unit 2 in the image sensor 1 according to the modification. The sensor unit 2 outputs an obtained imaging signal to the AD unit 5. The AD unit 5 outputs the imaging signal (digital signal) subjected to AD conversion or the like to the signal processing unit 6. A first processing unit 6a of the signal processing unit 6 performs reception processing of the digital signal and determines whether or not the digital signal is stored in the memory 9. When the digital signal is stored in the memory 9, the digital signal is stored in the memory cell unit 16 through the memory peripheral circuit unit 17 as in the first embodiment. When the digital signal is not stored in the memory 9, a second processing unit 6b performs signal processing on the digital signal and outputs the digital signal to the outside. It should be noted here that the image sensor 1 may combine the structure in the first embodiment and the structure in the first modification by having a plurality of memories 9.

Second Modification

Figure 9:
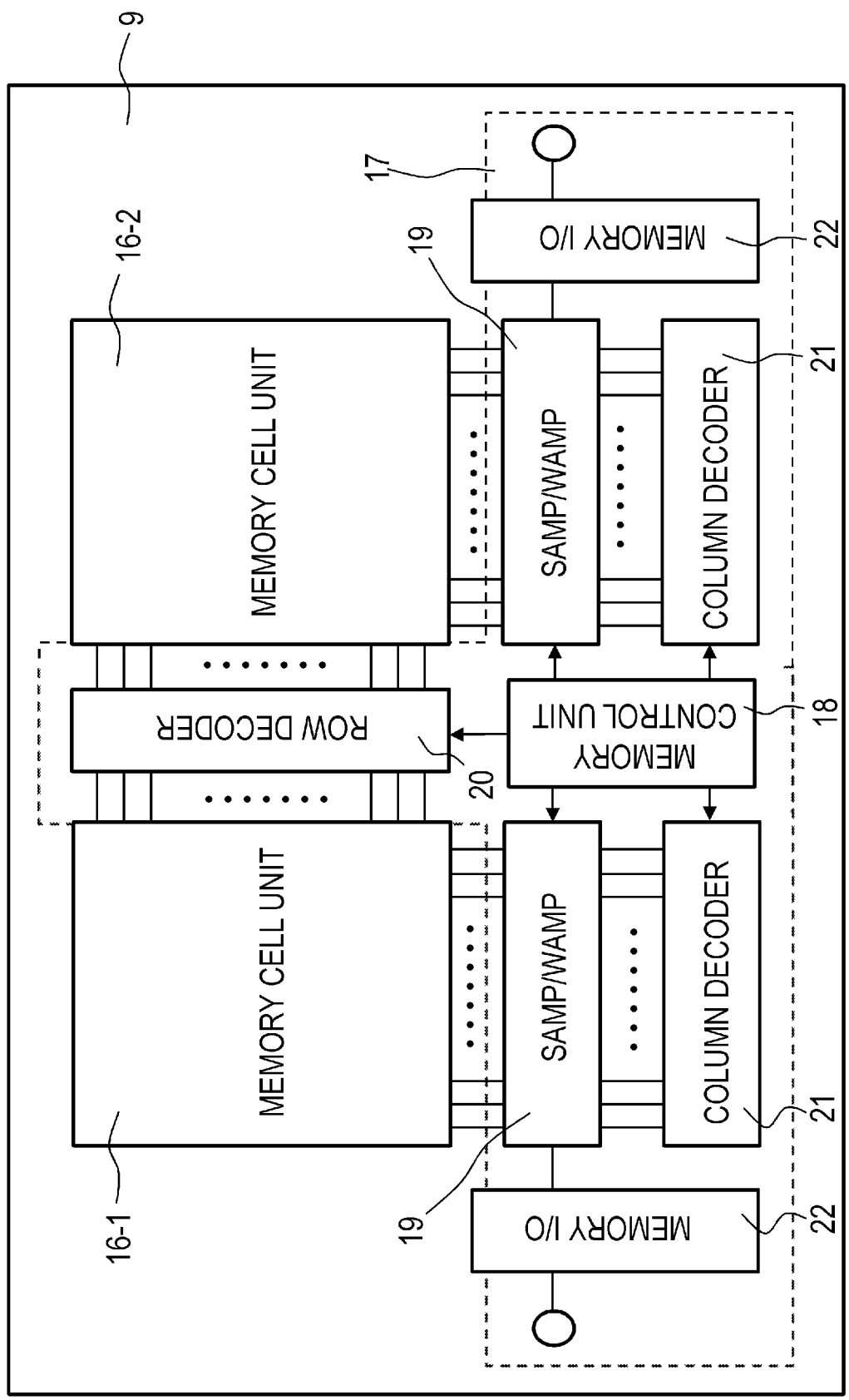
FIG. 9 is a figure for describing a logical structure of a memory according to a second modification.

In addition, as a modification of the first embodiment, the image sensor 1 may have a logical structure of the memory 9 as illustrated in FIG. 9. That is, the memory 9 may have a plurality of memory cell units 16: a memory cell unit 16-1 and a memory cell unit 16-2. In addition, the plurality of memory peripheral circuit units 17 may be present for the memory cell unit 16. The number of memory peripheral circuit units 17 does not need to match the number of memory cell units 16 as described above as long as the memory cell unit 16 and the memory peripheral circuit unit 17 are formed on different semiconductor substrates.

Second Embodiment

Figure 10A:
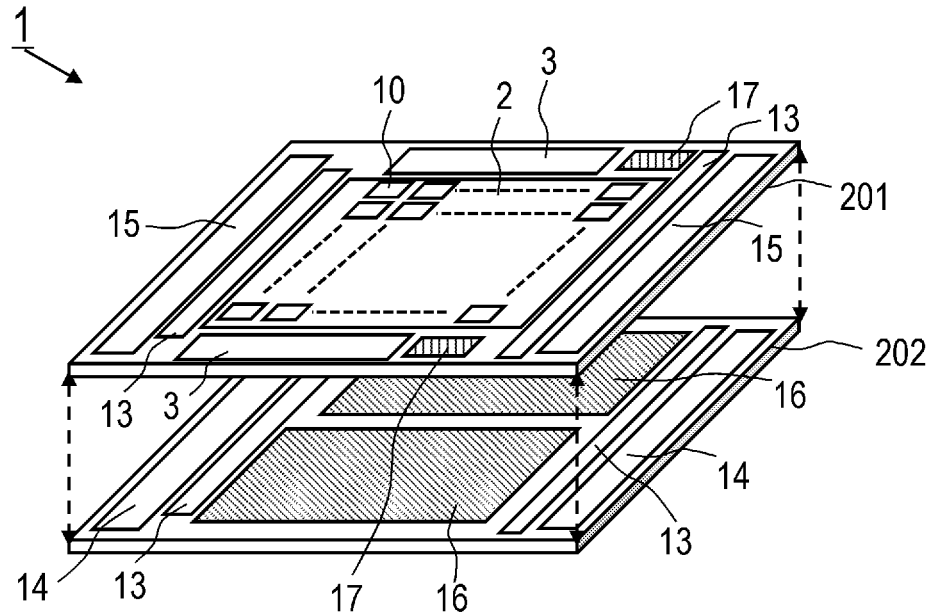
FIG. 10A illustrates an external appearance of an image sensor according to a second embodiment.

In the image sensor 1 described in the first embodiment, the sensor unit 2, the sensor peripheral circuit unit 3, and the memory cell unit 16 are formed on one substrate and the memory peripheral circuit unit 17 is formed on the other substrate. In contrast, in the image sensor 1 in a second embodiment, the sensor unit 2, the sensor peripheral circuit unit 3, and the memory peripheral circuit unit 17 are formed on a semiconductor substrate 201 and the memory cell unit 16 is formed on a semiconductor substrate 202 as illustrated in FIG. 10A. When the substrate having the memory cell unit 16 is assumed to be the second substrate, the semiconductor substrate 201 is the first substrate and the semiconductor substrate 202 is the second substrate in the embodiment.

When the sensor peripheral circuit unit 3 and the memory peripheral circuit unit 17 are formed on the same substrate as described above, since the memory peripheral circuit unit 17 can be wired to the sensor peripheral circuit unit 3 on the same substrate, the number (number of stacked connections) of inter-substrate connection units can be reduced. Specifically, the connections through the inter-substrate connection units 29-1 and 30-1 described with reference to FIG. 6 in the first embodiment are not necessary. That is, wiring can be simplified and the speed of memory operation can be enhanced by reduction in parasitic resistance. It should be noted here that finer transistors can be formed by optimizing process conditions such as exposure conditions according to the fixed layout pattern of the memory bit cell 42 in the memory cell unit 16 in the embodiment. This enables reduction of the area of the memory bit cells included in the memory cell unit 16.

Third Embodiment

Figure 10B:
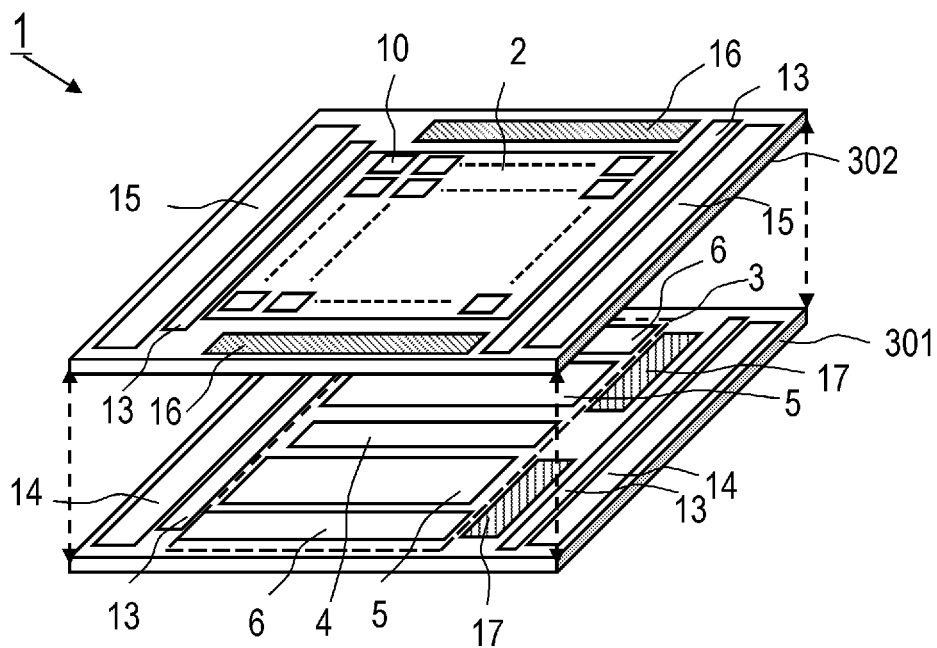
FIG. 10B illustrates an external appearance of an image sensor according to a third embodiment.

In the image sensor 1 described in the first embodiment, the sensor unit 2, the sensor peripheral circuit unit 3, and the memory cell unit 16 are formed on one substrate and the memory peripheral circuit unit 17 is formed on the other substrate. In contrast, in the image sensor 1 in a third embodiment, the sensor peripheral circuit unit 3 and the memory peripheral circuit unit 17 are formed on a semiconductor substrate 301 and the sensor unit 2 and the memory cell unit 16 are formed on a semiconductor substrate 302 as illustrated in FIG. 10B. When the substrate having the memory cell unit 16 is assumed to be the second substrate, the semiconductor substrate 301 is the first substrate and the semiconductor substrate 302 is the second substrate in the embodiment.

In the embodiment, the sensor unit 2 and the memory cell unit 16 are configured by forming the sensors 10 and the memory bit cells 42 in a two-dimensional array according to a fixed layout pattern. Accordingly, a manufacturing process and a design rule suitable for the fixed layout pattern can be adopted by forming the sensor unit 2 and the memory cell unit 16 on the same substrate, and the area of the memory bit cells 42 included in the memory cell unit 16 can be reduced. In addition, since the sensor unit 2 and the memory cell unit 16 use the fixed layout pattern, the sensor unit 2 and the memory cell unit 16 can be easily laid on the same substrate, the memory amount of the entire memory can be increased, and the area efficiency can be improved.

Since the sensor unit 2 and the AD unit 5 are formed on different substrates, transmission of a signal from the sensor unit 2 to the AD unit 5 needs to pass through the inter-substrate connection unit. In contrast, since the AD unit 5 and the memory peripheral circuit unit 17 are formed on the same substrate, the inter-substrate connection unit 29-1 and the inter-substrate connection unit 30-1 described with reference to FIG. 6 in the first embodiment are not necessary.

Fourth Embodiment

Figure 11A:
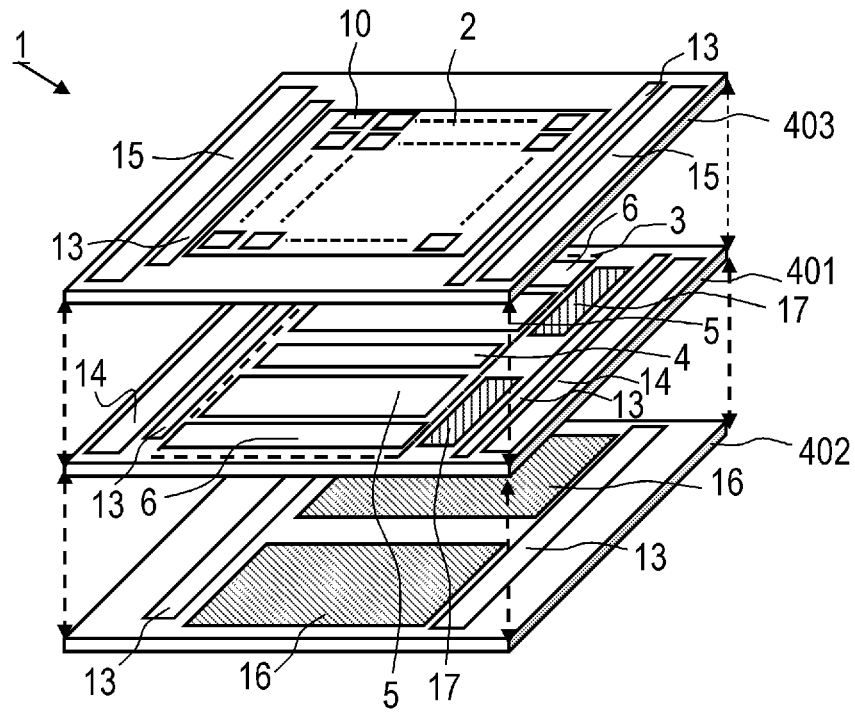
FIG. 11A illustrates an external appearance of an image sensor according to a fourth embodiment.

The image sensor 1 described in the first embodiment is configured by stacking the two substrates: the semiconductor substrate 101 and the semiconductor substrate 102. In contrast, in the image sensor 1 according to a fourth embodiment, the image sensor 1 is configured by stacking three substrates: a semiconductor substrate 401, a semiconductor substrate 402, and a semiconductor substrate 403. More specifically, as illustrated in FIG. 11A, the sensor peripheral circuit unit 3 and the memory peripheral circuit unit 17 are formed on the semiconductor substrate 401, the memory cell unit 16 is formed on the semiconductor substrate 402, and the sensor unit 2 is formed on the semiconductor substrate 403. The semiconductor substrate 401 and the semiconductor substrate 403 are electrically connected to each other through the via 13 and the inter-substrate connection units 30 and 47. When the substrate having the memory cell unit 16 is assumed to be the second substrate, the semiconductor substrate 401 is the first substrate, the semiconductor substrate 402 is the second substrate in the embodiment, and the semiconductor substrate 403 having the sensor unit 2 is the third substrate.

When the sensor unit 2, the sensor peripheral circuit unit 3 and the memory peripheral circuit unit 17, and the memory cell unit 16 are formed on different substrates as described above, circuits formed on these substrates can be manufactured under optimum conditions by different processes. For example, as for the sensor unit 2, a thermal processing process at high temperature is introduced to reduce noise in sensor characteristics without having effects on circuit characteristics other than the sensor unit 2, thereby improving crystal defect. In addition, since the sensor peripheral circuit unit 3 and the memory peripheral circuit unit 17 include mainly logic circuits, it is possible to adopt processes capable of manufacturing fine, low-voltage, and high-speed transistors. In addition, as for the memory cell unit 16, the memory characteristics can be improved by changing impurity doping conditions and making the circuit threshold higher than in the sensor peripheral circuit unit 3 and the memory peripheral circuit unit 17.

Since the sensor unit 2 and the AD unit 5 are formed on different substrates, these units need to be electrically connected to each other through an inter-substrate connection unit. Since the memory peripheral circuit unit 17 and the AD unit 5 are formed on the semiconductor substrate 401, the inter-substrate connection unit is not necessary to connect the memory peripheral circuit unit 17 and the AD unit 5 unlike the first embodiment. In addition, since the memory cell unit 16 is formed on the semiconductor substrate 402, the memory cell unit 16 and the memory peripheral circuit unit 17 need to be electrically connected to each other through the inter-substrate connection unit.

Fifth Embodiment

Figure 11B:
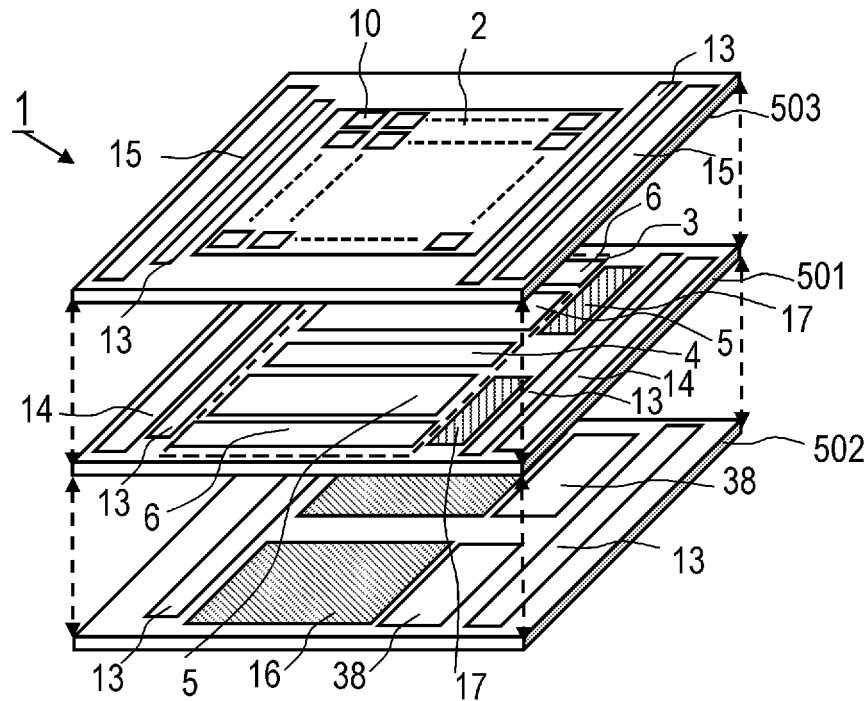
FIG. 11B illustrates an external appearance of an image sensor according to a fifth embodiment.

In the image sensor 1 described in the fourth embodiment, all components of the memory peripheral circuit unit 17 are formed on one substrate. In contrast, in the image sensor 1 according to a fifth embodiment, the memory peripheral circuit unit 17 is formed on two substrates. More specifically, as illustrated in FIG. 11B, in the image sensor 1, the sensor unit 2 is formed on a semiconductor substrate 503 and the sensor peripheral circuit unit 3 is formed on a semiconductor substrate 501. In the memory 9, the memory cell unit 16 and a part of the memory peripheral circuit unit 17 are formed on a semiconductor substrate 502 and the other of the memory peripheral circuit unit 17 is formed on the semiconductor substrate 501. When the substrate having the memory cell unit 16 is assumed to be the second substrate, the semiconductor substrate 501 is the first substrate, the semiconductor substrate 502 is the second substrate, and the semiconductor substrate 503 having the sensor unit 2 is the third substrate in the embodiment.

In the embodiment, the multiplexer 38, which is a part of the memory peripheral circuit unit 17, is formed on the semiconductor substrate 502 on which the memory cell unit 16 is formed. Since the multiplexer 38 summarizes signals, the number of inter-substrate connection units (vias 13) (the number of stacked connections) for connections between the semiconductor substrate 502 and the semiconductor substrate 501 can be reduced. Accordingly, a greater number of memory bit cells 42 can be connected by inter-substrate connection. In addition, since the interval between the vias 13 can be increased, the risk of a short circuit can also be reduced. It should be noted here that the multiplexer 38 does not need to be formed on the semiconductor substrate 502 and other elements (configurations) of the memory peripheral circuit unit 17 may be formed on the semiconductor substrate 502. The multiplexer 38 may be configured by using transistors of the memory bit cells 42 included in the memory cell unit 16. Formation of a first portion that is a part of the memory peripheral circuit unit 17 on one substrate and formation of a second portion that is another part on a substrate other than the one substrate are applicable not only to the image sensor 1 in the embodiment, but also to the image sensor 1 including two substrates as in the first embodiment.

Figure 12:
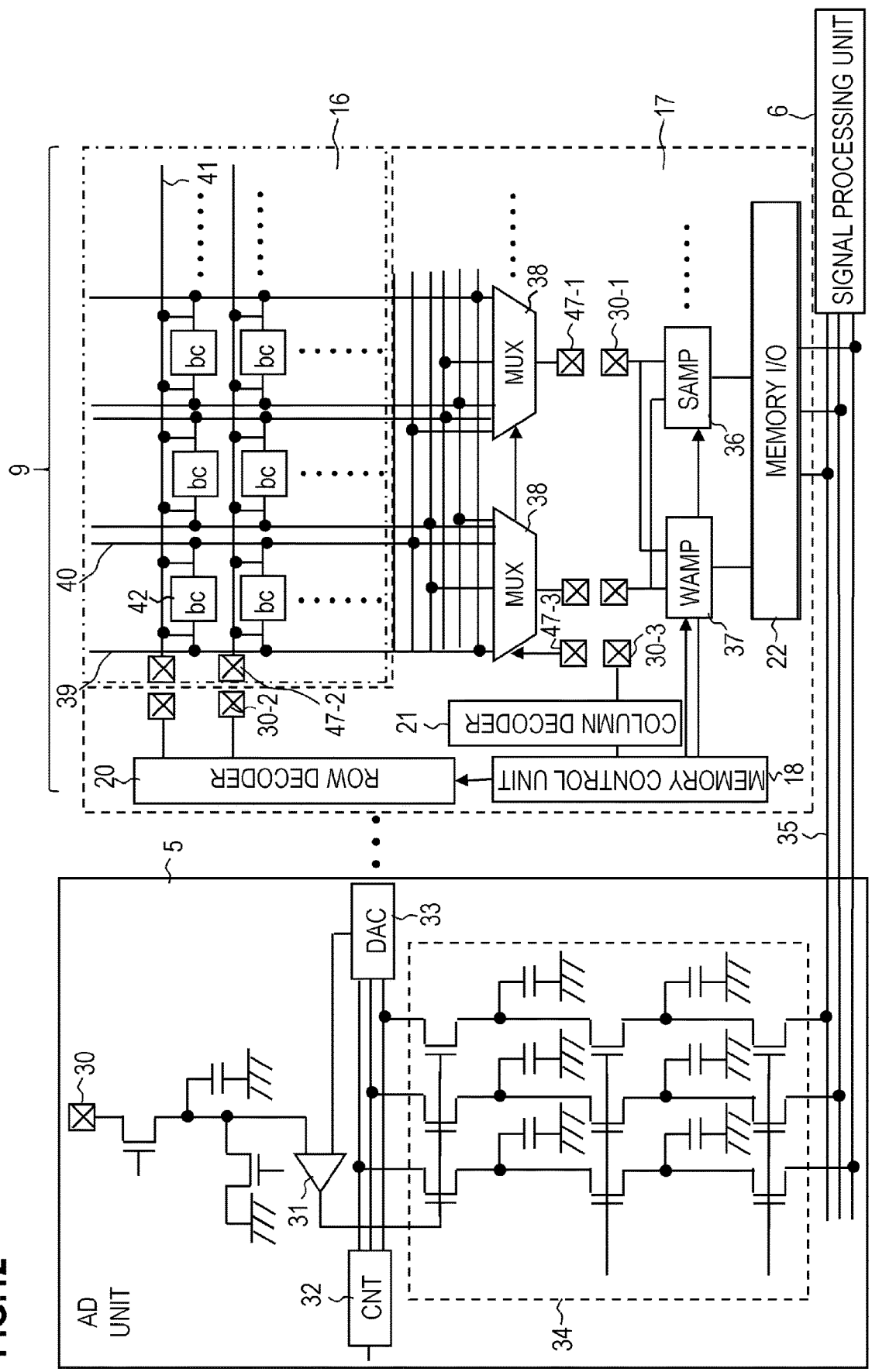
FIG. 12 is a circuit diagram for describing a memory according to the fifth embodiment.

FIG. 12 is a circuit diagram of a specific structure example of the memory 9 according to the embodiment. The signals output from the sensor unit 2 of the semiconductor substrate 503 are transmitted from the vias 13 to the AD unit 5 of the semiconductor substrate 501 through the inter-substrate connection unit 30 and then transmitted to the memory peripheral circuit unit 17 of the semiconductor substrate 501. The signals having been transmitted from the memory peripheral circuit unit 17 are transmitted from the inter-substrate connection units 30-1, 30-2, and 30-3 to inter-substrate connection units 47-1, 47-2, and 47-3 through the vias 13. After that, the signals are written to the memory bit cells 42 through the multiplexer 38, which is a part of the memory peripheral circuit unit 17 formed on the semiconductor substrate 502.

Third Modification

Figure 13A:
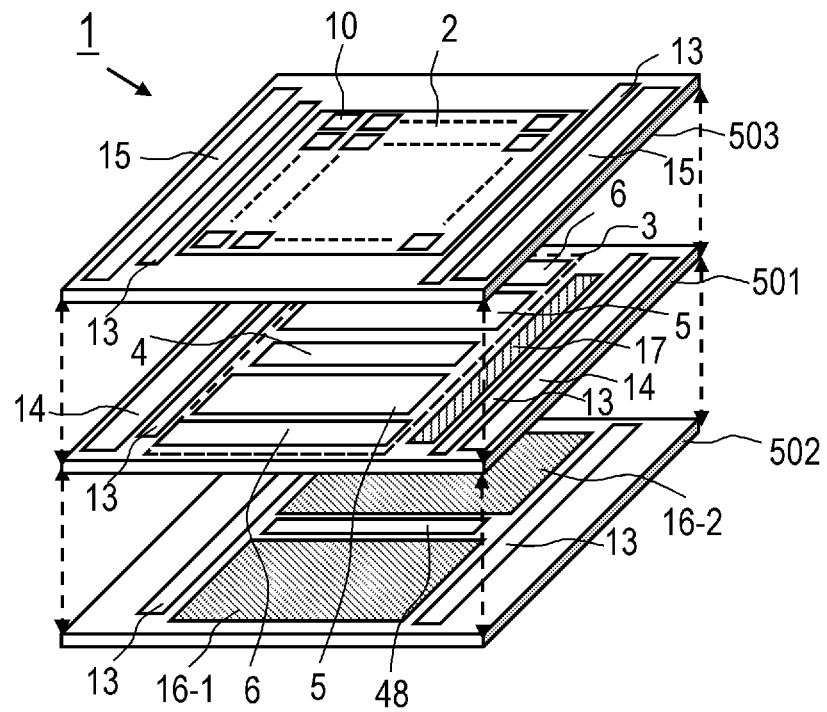
FIG. 13A illustrates an external appearance of an image sensor according to a third modification.
Figure 14:
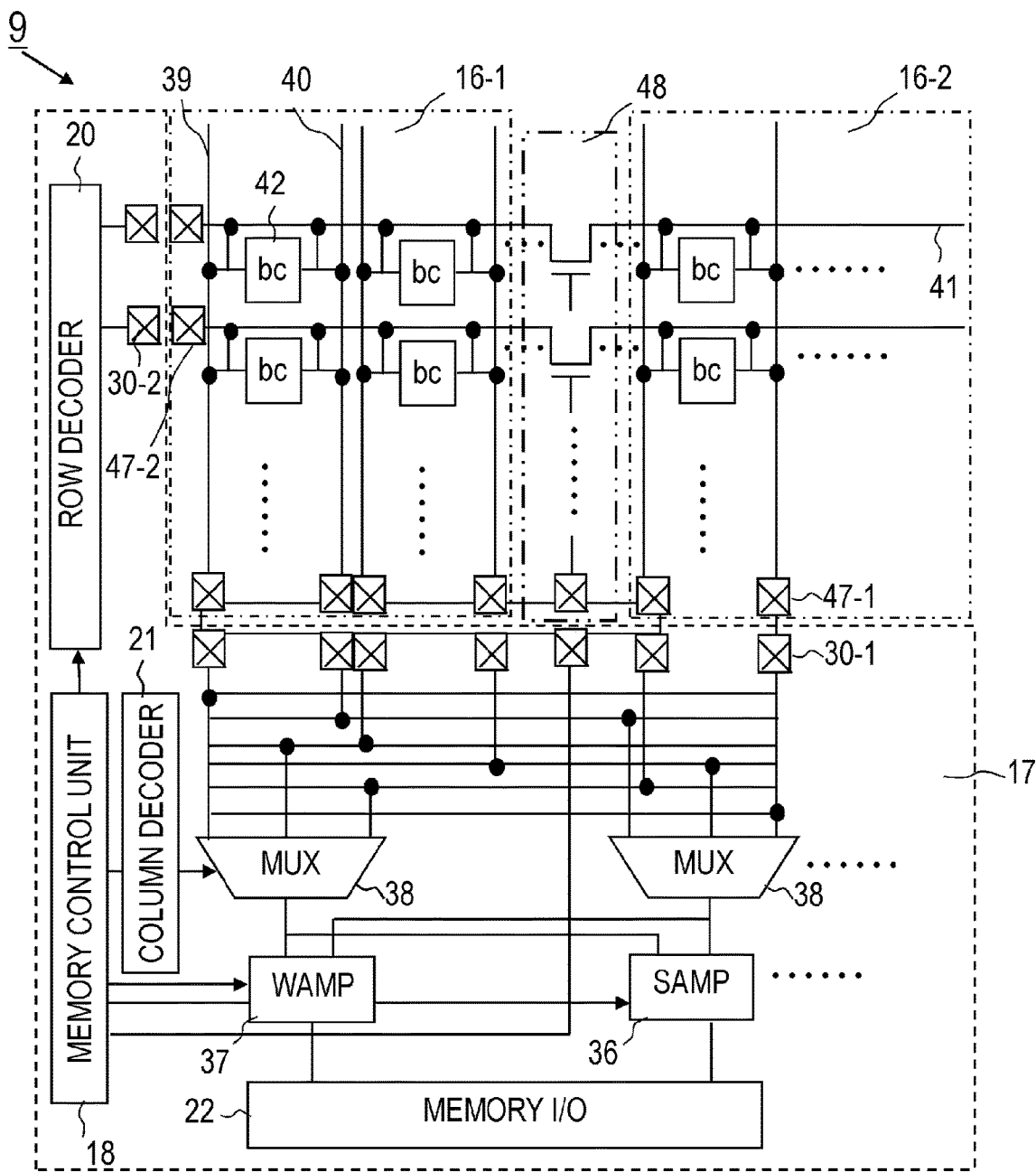
FIG. 14 is a circuit diagram for describing a memory according to the third modification.

FIG. 13A illustrates the image sensor 1 according to a third modification, which is another example of the fifth embodiment. In the modification, on the semiconductor substrate 502 on which the memory cell unit 16 is formed, a MOS transistor 48, which is one of components of the memory peripheral circuit unit 17, is formed between the word lines 41. Specifically, as illustrated in FIGS. 13A and 14, the two memory cell units 16-1 and 16-2 are formed for one memory peripheral circuit unit 17 and the MOS transistor 48 is formed between the memory cell unit 16-1 and the memory cell unit 16-2. This enables control of memory bit cell array connection along the word line 41 and selection of the amount of memory to be used according to the memory use and floor plan.

It should be noted here that the MOS transistor 48 may be configured by using a transistor of the memory bit cell 42 or may be configured by using a well tap cell formed between memory bit cell arrays to supply a fixed electric potential to the memory cell unit 16. That is, the memory peripheral circuit unit 17 does not need to have the MOS transistor 48. Formation of the MOS transistor 48 between the two memory cell units 16 is not limited to the image sensor 1 having three substrates as in the modification and is also applicable to the image sensor 1 having two substrates.

Fourth Modification

Figure 13B:
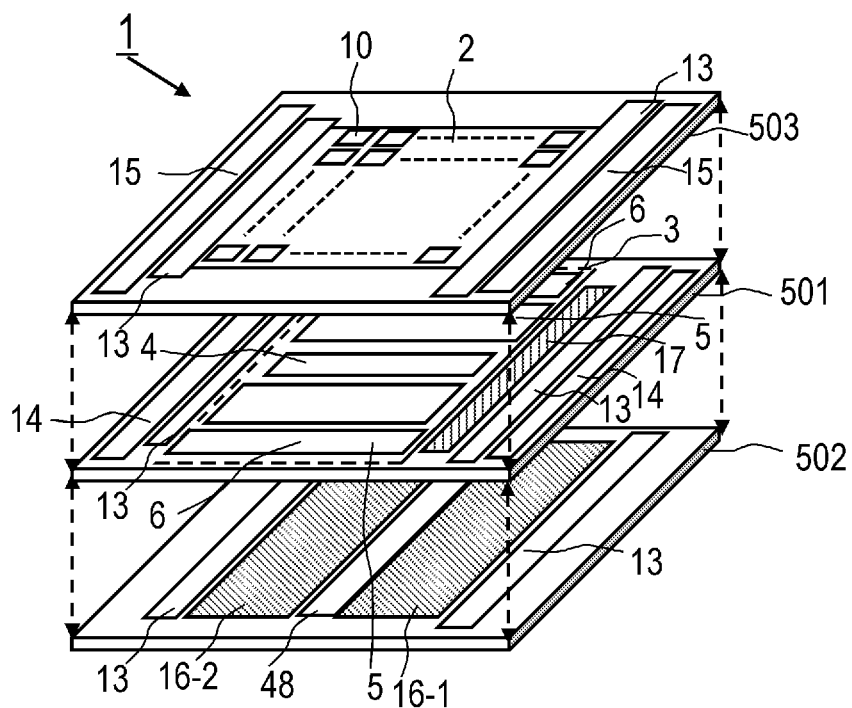
FIG. 13B illustrates an external appearance of an image sensor according to a fourth modification.
Figure 15:
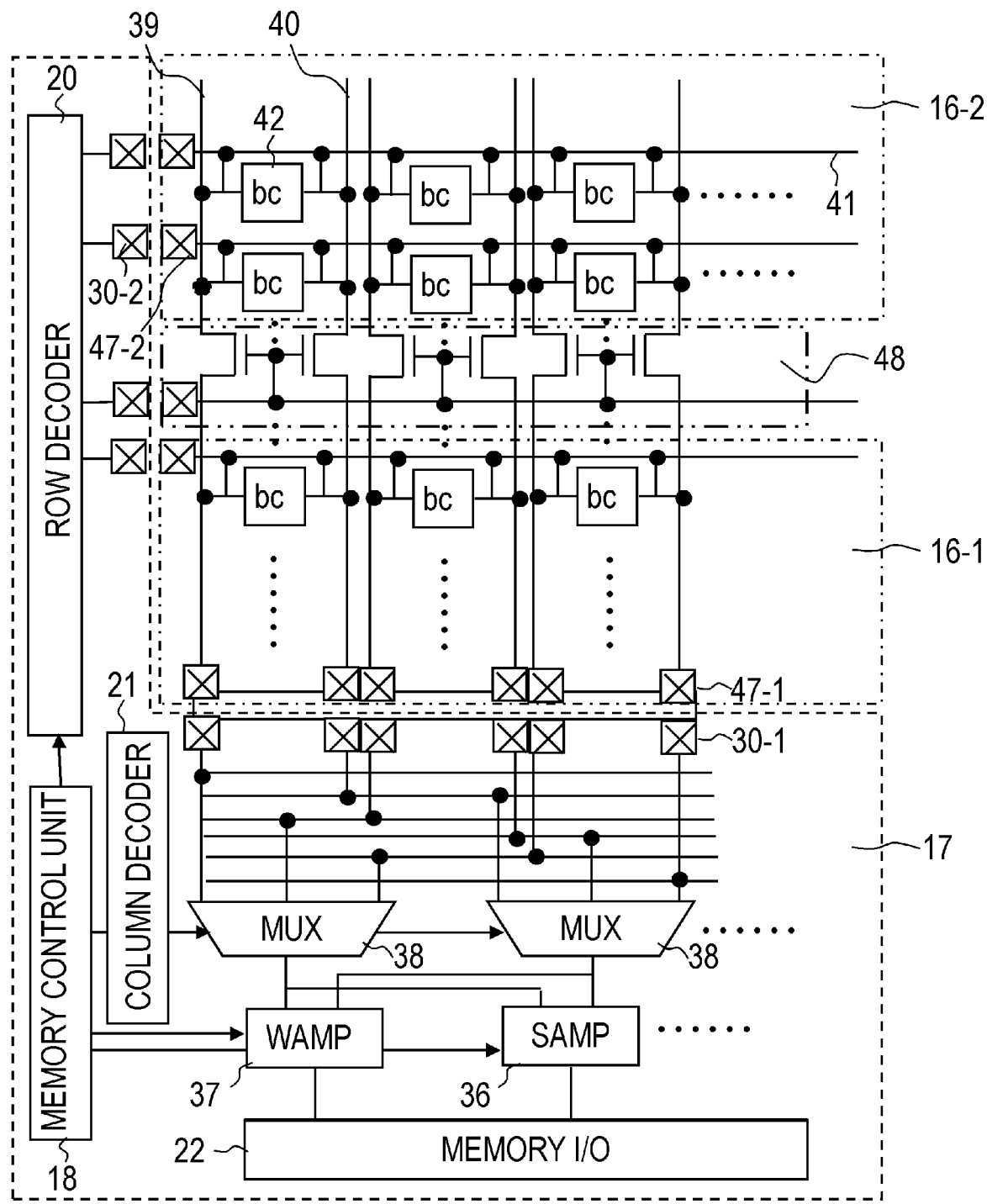
FIG. 15 is a circuit diagram for describing a memory according to the fourth modification.

FIG. 13B illustrates the image sensor 1 according to a fourth modification, which is another example of the fifth embodiment. In the modification, on the semiconductor substrate 502 on which the memory cell unit 16 is formed, the MOS transistor 48 described above is formed between the Bit lines 39. Specifically, as illustrated in FIGS. 13B and 15, the MOS transistor 48 is formed between the memory cell unit 16-1 and the memory cell unit 16-2. This enables control of memory bit cell array connection along the Bit line 39 and selection of the amount of memory to be used according to the memory use and floor plan.

Other Embodiments

The structures and processing described in the embodiments and modifications of the invention described above can be combined with each other. Although various arrangement examples of the sensor unit and the sensor peripheral circuit unit are described in the embodiments and modifications described above, the invention is not limited to these examples. That is, the sensor unit and the sensor peripheral circuit unit may be formed on any substrates as long as at least a part of the memory peripheral circuit unit and the memory cell unit are formed on different substrates.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-219443, filed on Nov. 22, 2018, which is hereby incorporated by reference herein in its entirety.

What is claimed is:

1. A photoelectric conversion device comprising:
a plurality of substrates which are stacked, the plurality of substrates including a first substrate and a second substrate electrically connected to each other;
a memory cell unit including
   (1) a memory cell array in which a plurality of memory cells are disposed in a two-dimensional array, each of the memory cells being configured to store a one-bit signal,
   (2) row-selection lines each of which is to be driven upon selection of a corresponding row of the memory cell array, and
   (3) column-selection lines each of which is to be driven upon selection of a corresponding column of the memory cell array; and
a memory peripheral circuit unit including (1) row-selection line connection portions for connecting to the row-selection lines of the memory cell unit and (2) column-selection line connection portions for connecting to the column-selection lines of the memory cell unit, the memory peripheral circuit unit being configured to drive the row-selection lines of the memory cell unit through the row-selection line connection portions and to drive the column-selection lines of the memory cell unit through the column-selection line connection portions, wherein
a first portion that is at least a part of the memory peripheral circuit unit is formed on the first substrate and
the memory cell unit is formed on the second substrate.

2. The photoelectric conversion device according to claim 1, wherein the first portion of the memory peripheral circuit unit includes at least one of (1) a memory control unit that controls a memory system, (2) a row decoder that selects a row of a memory bit cell included in the memory cell unit, (3) a column decoder that selects a column of the memory bit cell included in the memory cell unit, (4) an amplification unit that amplifies a signal to be read or written, and (5) an input-output port through which the signal is read or written.

3. The photoelectric conversion device according to claim 1, wherein a memory including the memory peripheral circuit unit and the memory cell unit is static random-access memory.

4. The photoelectric conversion device according to claim 1, wherein the memory cell unit and the first portion of the memory peripheral circuit unit are electrically connected to each other by inter-substrate connection in which a plurality of copper electrodes are brought into contact with each other.

5. The photoelectric conversion device according to claim 1, further comprising:
a sensor unit including a plurality of sensors that output signals based on photoelectric conversion, wherein
the memory peripheral circuit unit stores, in the memory cell unit, the signals output by the sensor unit.

6. The photoelectric conversion device according to claim 5, further comprising: a sensor peripheral circuit unit that includes at least one of a circuit that drives the sensor unit and a circuit that processes the signals output from the sensor unit.

7. The photoelectric conversion device according to claim 6, wherein the sensor unit and the sensor peripheral circuit unit are formed on the second substrate.

8. The photoelectric conversion device according to claim 6, wherein the sensor unit and the sensor peripheral circuit unit are formed on the first substrate.

9. The photoelectric conversion device according to claim 6, wherein the sensor unit is formed on the second substrate and the sensor peripheral circuit unit is formed on the first substrate.

10. The photoelectric conversion device according to claim 6, wherein
the plurality of substrates include a third substrate that is different from the first substrate and the second substrate,
the third substrate is electrically connected to the first substrate,
the sensor unit is formed on the third substrate, and
the sensor peripheral circuit unit is formed on the first substrate.

11. The photoelectric conversion device according to claim 7, wherein the signals output by the sensor unit are transferred between the substrates a plurality of times until the signals are stored in the memory cell unit after the signals are output by the sensor unit.

12. The photoelectric conversion device according to claim 1, wherein a second portion that is a part of the memory peripheral circuit unit other than the first portion is formed on the second substrate.

13. The photoelectric conversion device according to claim 12, wherein
the memory peripheral circuit unit has a multiplexer, and
the multiplexer is formed on the second substrate.

14. The photoelectric conversion device according to claim 1, wherein the entire memory peripheral circuit unit is formed on the first substrate.

15. The photoelectric conversion device according to claim 14, wherein a transistor included in the memory cell unit has a higher threshold than a transistor included in the memory peripheral circuit unit.

16. The photoelectric conversion device according to claim 1, wherein
two memory cell units are formed for the memory peripheral circuit unit, the memory cell unit being one of the two memory cell units, and
a transistor included in the memory peripheral circuit unit is formed between the two memory cell units.

* * * * *